US007095771B2

(12) United States Patent
Biard et al.

(10) Patent No.: US 7,095,771 B2
(45) Date of Patent: Aug. 22, 2006

(54) IMPLANT DAMAGED OXIDE INSULATING REGION IN VERTICAL CAVITY SURFACE EMITTING LASER

(75) Inventors: James R. Biard, Richardson, TX (US); James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/922,028

(22) Filed: Aug. 19, 2004

(65) Prior Publication Data
US 2005/0018729 A1    Jan. 27, 2005

Related U.S. Application Data

(63) Continuation of application No. 10/028,436, filed on Dec. 28, 2001, now Pat. No. 6,816,526.

(51) Int. Cl.
*H01S 5/00* (2006.01)
(52) U.S. Cl. ................... 372/46.01; 372/43.01
(58) Field of Classification Search ............ 372/46, 372/46.01
See application file for complete search history.

(56) References Cited

U.S. PATENT DOCUMENTS

| | | | |
|---|---|---|---|
| 5,056,098 A | 10/1991 | Anthony et al. | 372/45 |
| 5,245,622 A | 9/1993 | Jewell et al. | 372/45 |
| 5,328,854 A | 7/1994 | Vakhshoori et al. | 438/22 |
| 5,574,738 A | 11/1996 | Morgan | 372/28 |
| 6,064,683 A | 5/2000 | Johnson | |
| 6,256,331 B1 | 7/2001 | Kitoh et al. | |
| 6,751,245 B1* | 6/2004 | Wasserbauer et al. | 372/46.01 |
| 6,816,526 B1* | 11/2004 | Biard et al. | 372/46.015 |
| 2003/0042501 A1 | 3/2003 | Greenwald et al. | 257/189 |

OTHER PUBLICATIONS

Notification of Transmittal of the International Search Report or the Declaration, dated Jan. 14, 2004, relative to PCT. Application No. PCT/US02/39513, the foreign equivalent to the instant U.S. Appl. No. 10/028,436.
Chang C-H, et al., "Parasitics and Design Considerations on Oxide-Implant VCSELS," IEEE Photonics Technology Letters, IEEE inc. New York, US, vol. 13, No. 12, Dec. 2001, pp. 1274-1276, XP001076755, ISSN: 1041-1135.
Young, E. W., et al., "Single-Transverse-Mode Vertical-Cavity Lasers Under Continuous and Pulsed Operation," IEEE Photonics Technology Letters, Sep. 2001, IEEE, USA, vol. 13, No. 9, pp. 927-929, XP002265855, ISSN: 1041-1135.
K.D. Choquette, et al., "Low Threshold Voltage Vertical-Cavity Lasers Fabricated by Selective Oxidation," Electronic Letters, Nov. 24, 1994, vol. 30, No. 24, pp. 2043-2044.
Y.H. Lee, et al., "Top-Surface-Emitting GaAs Four-Quantum-Well Lasers Emitting at 0.85μm," Electronic Letters, May 24, 1990, vol. 26, No. 11, pp. 710-711.

(Continued)

Primary Examiner—Armando Rodriguez
Assistant Examiner—Dung T. Nguyen
(74) Attorney, Agent, or Firm—Workman Nydegger

(57) ABSTRACT

Optical transmitters are disclosed, one example of which includes a vertical cavity surface emitting laser that includes a substrate upon which a lower mirror is disposed. In this example, a spacer is disposed between the lower mirror and an active region. Another spacer separates the active region and an upper mirror. The upper mirror includes an oxide insulating region that is damaged by ion implantation so that desirable effects are achieved with respect to lateral sheet resistance, and quantum well recombination centers in the active region.

29 Claims, 2 Drawing Sheets

OTHER PUBLICATIONS

D.L. Huffaker, et al., "Native-Oxide Defined Ring Contact for Low Threshold Vertical-Cavity Lasers," Applied Physics Letters, Jul. 4, 1994, vol. 65, No. 1, pp. 97-99.

C.H. Chang, et al., "Parasitics and Design Considerations in Oxide-Implant VCSELs," IEEE Photonics Technology Letters, Dec. 2001, vol. 13, No. 12, pp. 1274-1276.

T.E. Sale, "Vertical Cavity Surface Emitting Lasers," Research Press Ltd. pp. 117-127, (1995).

A.J. Fischer, et al., "5.2mW Single-Mode Power from a Coupled Resonator Vertical-Cavity Laser," LEOS 2000 Proceedings, pp. 802-803.

G. Ronald Hadley, et al., "High-Power Single Mode Operation of Hybrid Ion-Implanted/Selectively-Oxidized VCSELs," pp. 804-805.

K.D. Choquette, et al., "High-Power Single Mode Operation of Hybrid Ion-Implanted/Selectively-Oxidized VCSELs," IEE International Semiconductor Laser Conference 200, Albuquerque, N.M. Conference Digest pp. 59-60.

K.D. Choquette, et al., "Single Transverse Mode Selectively Oxidized Vertical Cavity Lasers," Proceedings of the SPIE, vol. 3946 (2000) pp. 230-233.

* cited by examiner

IMPLANT DAMAGED OXIDE INSULATING REGION IN VERTICAL CAVITY SURFACE EMITTING LASER

RELATED APPLICATIONS

This application is a continuation, and claims the benefit, of U.S. patent application Ser. No. 10/028,436, entitled GAIN GUIDE IMPLANT IN OXIDE VERTICAL CAVITY SURFACE EMITTING LASER, filed Dec. 28, 2001 now U.S. Pat. No. 6,816,526, and incorporated herein in its entirety by this reference.

FIELD OF THE INVENTION

This invention relates to vertical cavity surface emitting lasers (VCSELs). More specifically, it relates to VCSEL current confinement structures.

DISCUSSION OF THE RELATED ART

VCSELs represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics.

VCSELs include semiconductor active regions, which can be fabricated from a wide range of material systems, distributed Bragg reflector (DBR) mirrors, current confinement structures, substrates, and contacts. Because of their complicated structure, and because of their material requirements, VCSELs are usually grown using metal-organic chemical vapor deposition (MOCVD) or molecular beam epitaxy (MBE).

FIG. 1 illustrates a typical VCSEL 10. As shown, an n-doped gallium arsenide (GaAS) substrate 12 has an n-type electrical contact 14. An n-doped lower mirror stack 16 (a DBR) is on the GaAS substrate 12, and an n-type lower spacer 18 is disposed over the lower mirror stack 16. An active region 20, usually having a number of quantum wells, is formed over the lower spacer 18. A p-type top spacer 22 is disposed over the active region 20, and a p-type top mirror stack 24 (another DBR) is disposed over the top spacer 22. Over the top mirror stack 24 is a p-type conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled such that resonance occurs at a predetermined wavelength (or at a multiple thereof). At least part of the top mirror stack 24 includes an insulating region 40 that provides for current confinement. The insulating region 40 is usually formed either by implanting protons into the top mirror stack 24 or by forming an oxide layer. In either case, the insulating region 40 defines a conductive annular central opening 42. Thus, the central opening 42 forms an electrically conductive path though the insulating region 40.

In operation, an external bias causes an electrical current 21 to flow from the p-type electrical contact 26 toward the n-type electrical contact 14. The insulating region 40 and the conductive central opening 42 confine that current such that it flows through the conductive central opening 42 to the active region 20. Some of the electrons that form the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, by providing a p-type substrate 12), different material systems can be used, operational details can be tuned for maximum performance, and additional structures, such as tunnel junctions, can be added.

While generally successful, VCSELs have problems. For example, to some extent the insulating region 40 is less than optimal. As previously noted the insulating region 40 and the central opening 42 form a current confinement region that guides current into the active region. Also as noted, the insulating region is usually produced either by implanting protons or by forming an oxide layer. Proton implantation is described by Y. H. Lee et al., Electron Letters, Vol. 26, No. 11, pp. 710–711 (1990) and by T. E. Sale, "Vertical Cavity Surface Emitting Lasers," Research Press Ltd., pp. 117–127 (1995), both of which are incorporated by reference. Oxide layers are taught by D. L. Huffaker et al., Applied Physics Letters, Vol. 65, No. 1, pp. 97–99 (1994) and by K. D. Choquette et al., Electron Letters, Vol. 30, No. 24, pp. 2043–2044 (1994), both of which are incorporated by reference.

Ion-implanted VCSELs are typically formed by a single energy proton implant in the form of an annular ring. Proton implantation creates structural defects that produce a relatively high resistance structure having an annular conductive region. This implanted region, or gain guide, is disposed such that the peak concentration of defects lies above the active region 20, but below the conduction region 9. The defect density does not drop to zero immediately above and below the implantation peak, rather it gradually drops from the peak value, so that a very small, but finite number of these defects occur even in the active region 20. While the relatively high resistance structure effectively steers current through the annular conductive region and into the active region, ion implantation does not produce significant optical guiding. Thus, ion implantation does not strongly impact the optical modes of the VCSEL. However, ion implantation defects can form non-radiative recombination centers in an active layer's P-N junction quantum wells. Such non-radiative recombination centers can cause the junction area under the implant to not emit light. Furthermore, the P-N junction under the implant has a lower forward voltage at constant current density than the P-N junction at the center of the cavity. In conjunction with the distributed nature of the series resistance of the P-N junction, the ion implanted non-radiative recombination centers cause the P-N junction current density to be highest in the center of the cavity. Until and unless other effects become large enough to counter this behavior, this makes the optical gain highest in the center of the cavity, which discourages the formation of higher order optical modes.

In contrast, VCSELs that use oxide current confinement regions can be made relatively small, which decreases threshold and operating currents. Additionally, since an oxide current confinement region has an optical index of refraction that is about half that of the region before oxidation, an oxide current confinement region forms a refractive optical index guide, which leads to transverse mode confinement, and which can further reduce operating current. The electrical properties of oxide current confinement VCSELs are very desirable. They can have higher bandwidths and lower lasing current thresholds (when compared to ion-implanted VCSELs). However, oxidation does not introduce non-radiative centers in the PN junction. Because of the distributed nature of the series resistance, oxide VCSELs have the highest P-N junction current density and the highest optical gain at the edge of the cavity. This current distribution tends to encourage the formation of higher order optical modes, particularly at large bias currents.

Oxide VCSELs (those that use oxide current confinement) typically include an AlGaAs layer having a high aluminum content (over 95%, and typically in the range of 97–98%) that is used to form the current confinement region. Such a high aluminum content structure tends to oxidize much more rapidly than the material layers used to form a P-type DBR mirror (which in this case might be 90% Al and 10% Ga). To fabricate the oxide current confinement, reactive ion etching is used to form trenches to the edge of the high Al content layer. Oxidation then typically proceeds to form a 10-micron deep oxide layer in the high Al content layer, while forming less then a 1 micron deep oxide layer in the mirror layers. Beneficially, the high Al content layer oxidizes with a complex aluminum oxide that is not only an electrical insulator, but also occupies about the same space as the layer before oxidation.

Both oxide VCSELs and ion-implanted VCSELs may have an additional ion-implantation structure disposed at a larger diameter than either the oxide aperture or the gain guide aperture, respectively. This implantation, if present, provides a continuous high resistance zone extending the entire distance from the p-type electrical contact 26 to the lower spacer 18. The function of this large-diameter implantation is to electrically isolate each device from its neighbors; it does not substantially affect the performance differences between the two described VCSEL types.

Because oxide VCSELs and ion-implanted VCSELs have different characteristics, VCSEL designers have had to select from among competing features, high output with higher order optical modes (oxide VCSELs), or lower output but with fewer optical modes (ion implanted VCSEL). Therefore, a new technique of forming VCSELs with the benefits of both ion implanted VCSELs and oxide VCSELs would be beneficial.

BRIEF SUMMARY OF AN EXEMPLARY EMBODIMENT OF THE INVENTION

In general, exemplary embodiments of the invention are concerned with vertical cavity surface emitting lasers ("VCSEL") that include an oxidized insulation region damaged by an ion implantation process. In one exemplary embodiment, a VCSEL is provided that includes a substrate upon which a lower mirror is disposed. In this example, a spacer is disposed between the lower mirror and an active region. Another spacer separates the active region and an upper mirror. The upper mirror includes an oxide insulating region that is damaged by ion implantation so that desirable effects are achieved with respect to lateral sheet resistance, and quantum well recombination centers in the active region. In this way, VCSELs are produced that have advantages associated with ion implanted VCSELs, as well as advantages associated with oxide VCSELs.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings.

Figure 1:
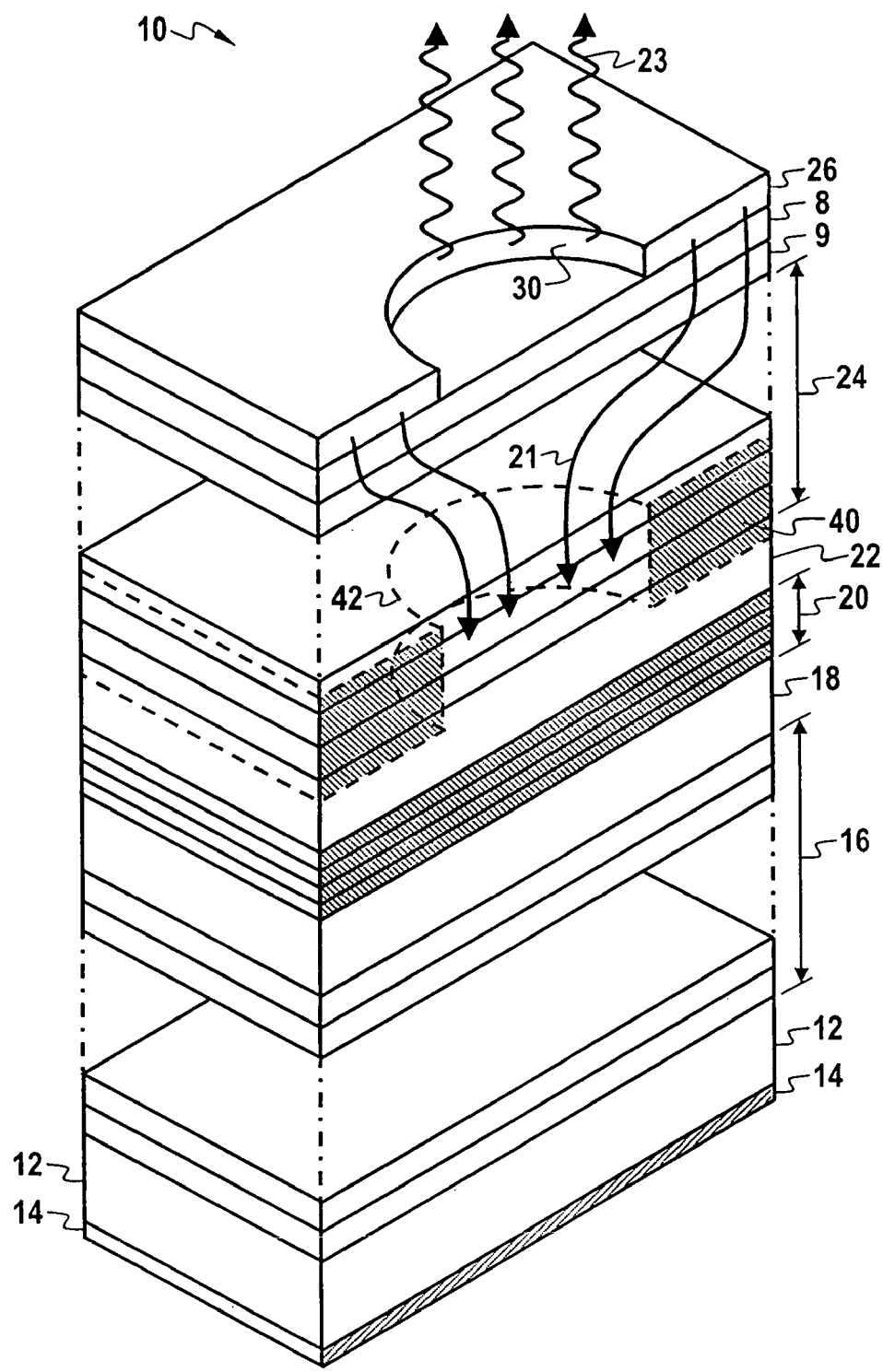
FIG. 1 illustrates a typical vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Reference will now be made in detail to an embodiment of the present invention, example of which is illustrated in the accompanying drawings.

Figure 2:
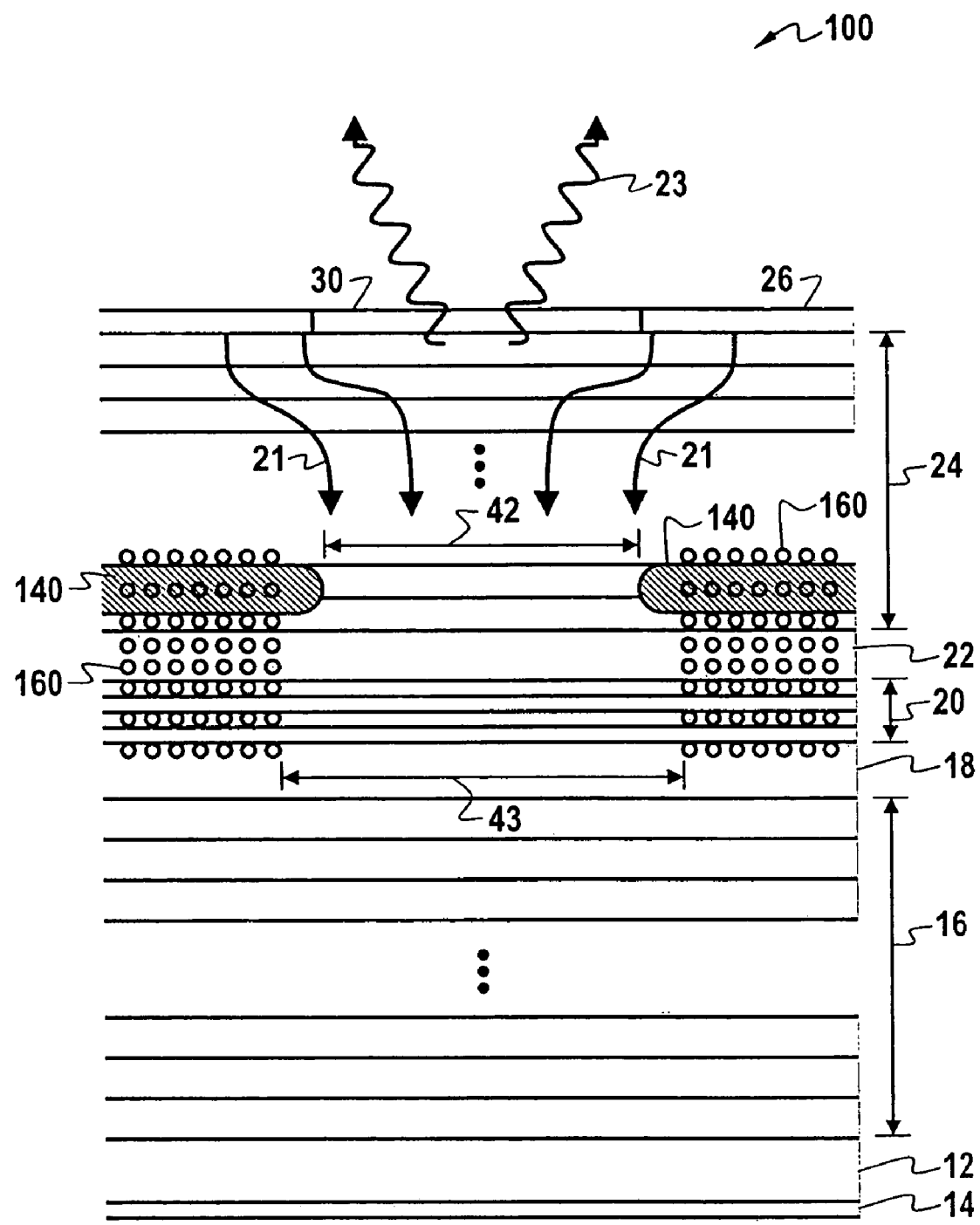
FIG. 2 illustrates a vertical cavity surface emitting laser according to the principles of the present invention.

The principles of the present invention provide for VCSELs that use a current confinement structure comprised of both an oxide layer and an ion implanted gain guide. An example of such a VCSEL is the VCSEL 100 illustrated in FIG. 2. FIG. 2 should be understood as a "cut-away" schematic depiction of a section of a VCSEL that is generally configured as shown in FIG. 1. Thus, the same element numbers will be used for similar elements in FIG. 2 that were used in FIG. 1.

As shown in FIG. 2, the VCSEL 100 includes an n-doped gallium arsenide (GaAS) substrate 12 having an n-type electrical contact 14. An n-doped lower mirror stack 16 (a DBR) is on the GaAS substrate 12, and an n-type lower spacer 18 is disposed over the lower mirror stack 16.

An active region 20 having P-N junction structures with a number of quantum wells is formed over the lower spacer 18. The composition of the active region 20 is beneficially AlGaAs, with the specific aluminum varying in different layers that form the active region 20. For example, one layer may have between twenty and thirty percent of aluminum, while an adjacent layer might have between zero and five percent of aluminum. There could be more or fewer alternating layers, depending how the quantum wells are to be located within the active region 20. On the active region 20 is a p-type top spacer 22. A p-type top mirror stack 24 (another DBR) is disposed over the top spacer 22. Over the top mirror stack 24 is a p-type conduction layer 9, a p-type GaAs cap layer 8, and a p-type electrical contact 26. As in the VCSEL 10 (see FIG. 1), the lower spacer 18, the active layer 20, and the top spacer 22 separate the lower mirror stack 16 from the top mirror stack 24 such that an optical cavity that is resonant at a specific wavelength is formed.

Still referring to FIG. 2, a portion of the top mirror stack 24, and possibly a thin region of the top spacer 22, includes an oxide-insulating region 140. That oxide layer is produced by forming a portion of the top mirror stack 24 from an AlGaAs layer(s) having a high aluminum content (greater than 95%, and beneficially in the range of 97–98%), and then oxidizing that high aluminum content layer to form an annular oxide ring. Oxidation produces the oxide-insulating region 140. Furthermore, a spatial region, which includes part of the oxide-insulating region 140, is implanted with ions 160. The damage from these ions beneficially extends into the active layer 20. A central opening 42 is the aperture in insulating region 140. A central opening 43 in the gain-guide implant region 160 is not implanted with ions (the spatial region of the implant does not extend completely across the central opening 42). The aperture 42 in the insulating region 140 may be either larger or smaller in diameter than the damage free region of gain-guide implant aperture 43.

In operation, an external bias causes an electrical current 21 to flow from the p-type electrical contact 26 toward the n-type electrical contact 14. The insulating region 140 and its conductive central opening 42 guide the current 21 through the conductive central openings 42 and 43 such that the current 21 flows into the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 2, the light 23 passes through the p-type conduction layer 9, through the p-type GaAs cap layer 8, through an aperture 30 in the p-type electrical contact 26, and out of the surface of the vertical cavity surface emitting laser 100.

The oxide-insulating region 140 is beneficially introduced at the proper location and thickness to achieve the best optical results, while the energy and dose of the implanted ions that form the damaged region 160 can be tailored to independently control the lateral sheet resistance and non-radiative centers within the active region. Proper VCSEL design enables achievement of a low order optical mode structure with low threshold, high speed, and high efficiency.

Prior art descriptions of VCSELs formed with both oxide and gain guide apertures differ fundamentally from the current invention. For example, "5.2 mW Single-Mode Power from a Coupled Resonator Vertical-Cavity Laser," by A. J. Fischer, et al., LEOS 2000 Proceedings pp. 802–803, and "High-Power Single Mode Operation of Hybrid Ion-Implanted/Selectively-Oxidized VCSELs," by G. Ronald Hadley, et al., pp. 804–805 describe VCSELs with both oxide and gain guide implant apertures, but the implant aperture is intentionally positioned entirely above the oxide aperture, and performs a different function, with no effect on either the lateral resistance under the oxide aperture or on recombination centers in the PN-junction region.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A vertical cavity surface emitting laser, comprising:
   a substrate;
   a bottom mirror above the substrate;
   an active region above the bottom mirror;
   a top mirror located above the active region and including an oxide insulating region; and
   a gain guide ion implant region extending at least into the oxide insulating region such that a portion of the oxide insulating region includes damage from implanted ions, and the gain guide ion implant region extending below the oxide insulating region and at least into an unoxidized portion of the top mirror.

2. The vertical cavity surface emitting laser as recited in claim 1, wherein a substantial portion of the gain guide ion implant region is located below the oxide insulating region.

3. The vertical cavity surface emitting laser as recited in claim 1, wherein the gain guide ion implant region extends completely through the oxide insulating region.

4. The vertical cavity surface emitting laser as recited in claim 1, wherein the oxide insulating region defines a first central opening, and the gain guide ion implant region defines a second central opening.

5. The vertical cavity surface emitting laser as recited in claim 4, wherein one of the following is larger than the other: a diameter of the first central opening; and, a diameter of the second central opening.

6. The vertical cavity surface emitting laser as recited in claim 1, wherein the oxide insulating region and the gain guide ion implant region collectively define a current confinement region.

7. The vertical cavity surface emitting laser as recited in claim 1, wherein the gain guide ion implant region extends at least partway into the active region such that a portion of the active region includes damage from implanted ions.

8. The vertical cavity surface emitting laser as recited in claim 1, wherein the substrate substantially comprises n-doped GaAS.

9. The vertical cavity surface emitting laser as recited in claim 1, wherein at least one of the following comprises a DBR: the bottom mirror; and, the top mirror.

10. The vertical cavity surface emitting laser as recited in claim 1, wherein an unoxidized portion of the top mirror substantially comprises an aluminum-containing III–V compound semiconductor.

11. The vertical cavity surface emitting laser as recited in claim 1, wherein the active region substantially comprises AlGaAs.

12. The vertical cavity surface emitting laser as recited in claim 1, wherein the vertical cavity surface emitting laser has a lateral sheet resistance that is at least partially a function of energy and dose of implanted ions that form the gain guide ion implant region.

13. The vertical cavity surface emitting laser as recited in claim 1, wherein the active region includes a plurality of quantum wells.

14. The vertical cavity surface emitting laser as recited in claim 1, further comprising:
   a bottom spacer interposed between the substrate and the bottom mirror; and
   a top spacer interposed between the active region and the top mirror.

15. The vertical cavity surface emitting laser as recited in claim 14, wherein the bottom spacer, active layer, and top spacer separate the top mirror and bottom mirror such that an optical cavity is defined that is resonant for at least one specific wavelength.

16. The vertical cavity surface emitting laser as recited in claim 14, wherein the bottom spacer comprises an n-type spacer, and the top spacer comprises a p-type spacer.

17. A method for producing a vertical cavity surface emitting laser, comprising:
   forming a bottom mirror on a substrate;
   forming an active region above the bottom mirror;
   forming a top mirror above the active region;
   oxidizing at least a portion of the top mirror to form an oxide insulating region; and
   defining a gain guide ion implant region that extends at least into the oxide insulating region of the top mirror and the gain guide ion implant region extending below the oxide insulating region and at least into an unoxidized portion of the top mirror, the gain guide ion implant region being defined by an ion implantation process that causes damage in areas to which the gain guide ion implant region extends.

18. The method as recited in claim 17, wherein a substantial portion of the gain guide ion implant region is located below the oxide insulating region.

19. The method as recited in claim 17, wherein the gain guide ion implant region extends completely through the oxide insulating region.

20. The method as recited in claim 17, wherein the gain guide ion implant region extends at least partway into the active region.

21. The method as recited in claim 17, wherein the gain guide ion implant region extends completely through the active region.

22. The method as recited in claim 17, wherein ion implantation produces non-radiative recombination centers in the active region.

23. The method as recited in claim 17, wherein the oxide insulating region is formed so as to define a first central opening, and the gain guide ion implant region is formed so as to define a second central opening, the first and second central openings having different sizes.

24. The method as recited in claim 17, wherein an unoxidized portion of the top mirror substantially comprises an aluminum-containing III–V compound semiconductor.

25. The method as recited in claim 17, wherein the active region comprises a plurality of quantum wells.

26. The method as recited in claim 17, wherein an energy and dose of implanted ions of the gain guide ion implant region are tailored to independently control a lateral sheet resistance, and non-radiative centers within the active region.

27. The method as recited in claim 17, wherein at least one of the following comprises a DBR: the bottom mirror; and, the top mirror.

28. The method as recited in claim 17, further comprising:
   forming a bottom spacer above the substrate and below the bottom mirror; and
   forming a top spacer above the active region and below the top mirror.

29. The method as recited in claim 28, wherein the gain guide ion implant region extends at least partway into the bottom spacer.

* * * * *